United States Patent
Chen

(12) 
(10) Patent No.: US 6,171,908 B1
(45) Date of Patent: Jan. 9, 2001

(54) METHOD OF FABRICATING SELF-ALIGNED SPLIT GATE FLASH MEMORY CELL

(75) Inventor: Bin-Shing Chen, Hsinchu (TW)

(73) Assignee: Winbond Electronics Corporation, Hsinchu (TW)

(*) Notice: Under 35 U.S.C. 154(b), the term of this patent shall be extended for 0 days.

(21) Appl. No.: 09/123,585

(22) Filed: Jul. 28, 1998

Related U.S. Application Data

(60) Provisional application No. 60/079,287, filed on Mar. 25, 1998.

(51) Int. Cl.[7] .................................................. H01L 21/8247
(52) U.S. Cl. ............................................ 438/266; 438/596
(58) Field of Search ................................. 438/257, 259, 438/264, 266, 267, 593, 594, 595, 596

(56) References Cited

U.S. PATENT DOCUMENTS

| | | | |
|---|---|---|---|
| 4,997,781 | * | 3/1991 | Tigelaar .................................. 438/593 |
| 5,488,586 | | 1/1996 | Madurawe et al. ................... 365/218 |
| 5,622,881 | * | 4/1997 | Accocella et al. .................... 438/264 |
| 5,960,284 | * | 9/1999 | Lin et al. ............................... 438/259 |

* cited by examiner

Primary Examiner—Chandra Chaudhari
(74) Attorney, Agent, or Firm—Townsend & Townsend & Crew LLP

(57) ABSTRACT

A technique for forming an integrated circuit device having a self-aligned gate layer. The method includes a variety of steps such as providing a substrate (217), which is commonly a silicon wafer. Field isolation regions (201) including a first isolation region and a second isolation region are defined in the semiconductor substrate. A recessed region is defined between the first and second isolation regions. The isolation regions (201) are made using a local oxidation of silicon process, which is commonly called LOCOS, but can be others. A thickness of material (205) such as polysilicon is deposited overlying or on the first isolation region, the second isolation region, and the active region. A step of selectively removing portions of the thickness of material overlying portions of the first isolation region and the second isolation region is performed, where the removing step forms a substantially planar material region in the recessed region. The substantially planar material region is self-aligned into the recessed region using the removing step.

15 Claims, 5 Drawing Sheets

METHOD OF FABRICATING SELF-ALIGNED SPLIT GATE FLASH MEMORY CELL

This application claims the benefit of U.S. Provisional application No. 60/079,287 filed Mar. 25, 1998, the disclosure of which is incorporated by reference.

BACKGROUND OF THE INVENTION

The present invention relates to semiconductor integrated circuits and their manufacture. The invention is illustrated in an example with regard to the manufacture of a "flash" electrically-erasable programmable read only memory ("Flash EEPROM") cell, but it will be recognized that the invention has a wider range of applicability. Merely by way of example, the invention may be applied in the manufacture of other semiconductor devices such as CMOS, microcontrollers, microprocessors, application specific integrated circuits, embedded memory applications, among others.

Industry has used or proposed a variety of memory devices. An example of such a memory device is an erasable programmable read-only memory ("EPROM") device. The EPROM device is both readable, writable, and erasable, i.e., programmable. The EPROM is implemented using a floating gate field effect transistor, which has certain binary states. That is, a binary state is represented by the presence or absence of charge on the floating gate. The charge is generally sufficient to prevent conduction even when a normal high signal is applied to the gate of the EPROM transistor.

A wide variety of EPROMs is available. In a traditional form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E²PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Flash memory cells, however, are often bulky and difficult to fabricate in a desired space due to complex geometries of the multiple gate layers used to form the control and floating gates. Accordingly, flash memory cells generally cannot be integrated as tightly or closely as other types of memory devices. Additionally, flash memory cells often require a high gate coupling ratio to achieve desirable programmability and functionality. High gate coupling ratios are often achieved by way of increasing the surface area of the control gate relative to the floating gate while reducing the surface area of the floating gate that is coupled to the channel region of the memory cell. Unfortunately, it is often difficult to increase the gate coupling ratio without significantly increasing the size of the memory cell.

From the above it is seen that a flash memory cell structure that is relatively easy to fabricate, cost effective, and reliable is clearly desired.

SUMMARY OF THE INVENTION

According to the present invention, a technique including a method and device for the fabrication of an integrated circuit such as a flash memory cell is provided. In an exemplary embodiment, the present invention provides a self-aligned floating gate layer or poly-1 layer using a novel sequence of fabrication processes. This self-aligned floating gate layer reduces the size of the resulting flash memory cell according to certain embodiments.

In a specific embodiment, the present invention provides a novel method of forming a semiconductor integrated circuit device, such as flash memory devices. The method includes a variety of steps such as providing a semiconductor substrate, which is commonly a silicon wafer. Field isolation regions including a first isolation region and a second isolation region are defined in the semiconductor substrate. An active region is defined between the first and second isolation regions, and is generally defied in a recessed region between the first isolation region and the second isolation region. The isolation regions are made using a local oxidation of silicon process, which is commonly called LOCOS, but can be others. The method also includes a step of forming a dielectric layer overlying the active region, where the dielectric layer can be a tunnel oxide layer for a flash memory device.

A thickness of material such as polysilicon is deposited overlying the first isolation region, the second isolation region, and the active region. A step of selectively removing portions of the thickness of material overlying portions of the first isolation region and the second isolation region is performed, where the removing step forms a substantially planar material region in the recessed region. The substantially planar material region is self-aligned into the recessed region using the removing step. In a preferred embodiment, the step of selectively removing is performed using chemical mechanical polishing or planarization. The self-aligned material region can be a floating gate in, for example, the flash memory device.

In an alternative embodiment, the present invention provides a memory cell with a self-aligned floating gate structure. The memory cell includes a semiconductor substrate that has a first isolation region, and a second isolation region defined in the semiconductor substrate. Between the isolation regions is a recessed region where an active region is defined in the recessed region between the first isolation region and the second isolation region. A tunnel dielectric layer (e.g., oxide, oxynitride, nitride) is defined overlying the active region. A self-aligned floating gate layer is defined within the recessed region of the active region. A dielectric layer is defined overlying the floating gate layer. A control gate layer is defined overlying a portion of the floating gate layer. The floating gate layer and the control gate layer define a split gate structure. The self-aligned floating gate layer reduces cell size and is generally easier to fabricate accurately than conventional techniques.

In still a further embodiment, the present invention provides a method of forming an integrated circuit device having a self-aligned gate layer or conductive layer. The method includes a variety of steps such as providing a substrate, which is commonly a silicon wafer. Field isolation regions including a first isolation region and a second isolation region are defined in the semiconductor substrate. A recessed region is defined between the first and second isolation regions during the formation of the isolation regions. The isolation regions are made using a local oxidation of silicon process, which is commonly called LOCOS, but can be others. A thickness of material such as polysilicon is deposited overlying or on the first isolation region, the second isolation region, and the active region. The thickness of material fills the recessed region and protrudes outside the recessed region as it lays over the isolation regions, which are commonly higher than the recessed region relative to the isolation regions. A step of selectively removing portions of the thickness of material overlying portions of the first isolation region and the second isolation region is performed, where the removing step forms a substantially planar material region in the recessed region. The substantially planar material region is self-aligned into the recessed region using the removing step.

Numerous benefits are achieved using the present invention over pre-existing or conventional techniques. In some embodiments, the present invention can provide a smaller cell size that improves device integration using a self-aligned poly-1 process. Additionally, the present invention can use presently available fabrication tools, such as chemical mechanical polishing or planarization, which do not require substantial capital costs if these tools are already available. Furthermore, the invention can prevent misalignment errors in some embodiments using the present self-aligned process. These and other benefits are described throughout the present specification and more particularly below.

The present invention achieves these benefits in the context of known process technology. However, a further understanding of the nature and advantages of the present invention may be realized by reference to the latter portions of the specification and attached drawings.

DETAILED DESCRIPTION OF THE SPECIFIC EMBODIMENTS

Conventional Flash EEPROM Structures

Figure 1:
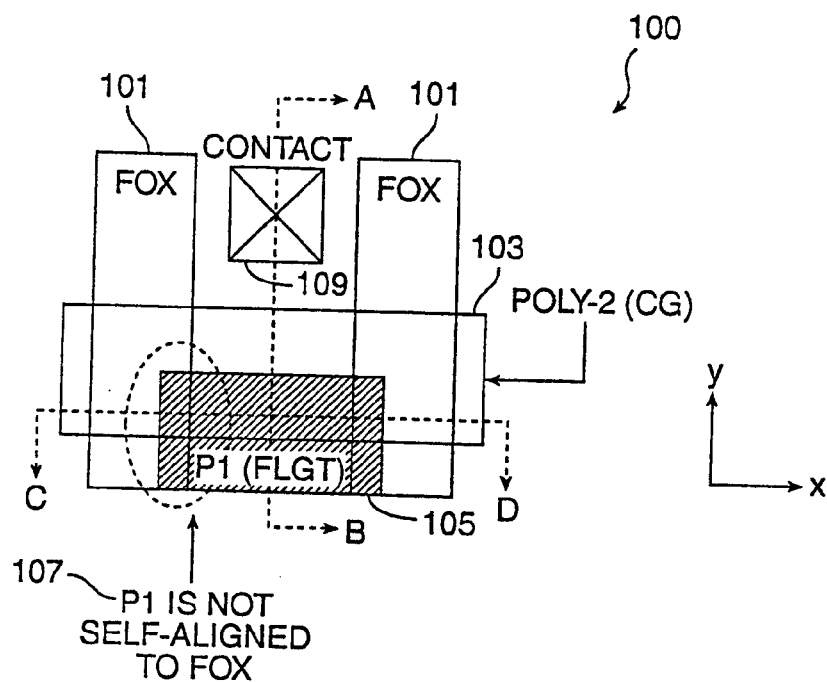
FIGS. 1–2 illustrate simplified diagrams of a conventional split gate flash memory cell.
Figure 2:
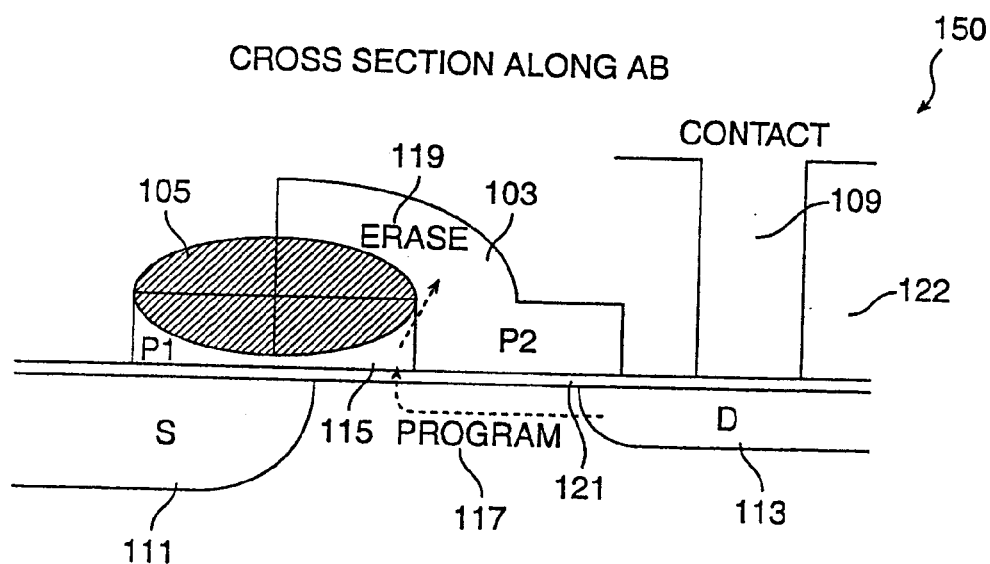

FIGS. 1 and 2 illustrate simplified diagrams of a conventional split gate flash memory cell. As shown, the diagrams include a top-view or plan view 100 and a side-view or cross-sectional view 150 of the conventional split gate flash memory cell. The top-view diagram 100 shows field isolation oxide region(s) 101, which is commonly termed the FOX region. The FOX region separates and/or isolates one cell region from another cell region in the active device region. A flash memory device is defined between the FOX regions. The flash memory device includes a variety of features such as a floating gate 105 that is defined between and overlaps a portion of the FOX regions. A control gate 103 is defined overlying a portion of the floating gate and is defined overlying portions 107 of the FOX regions. A contact 109 to a source/drain region is also shown. The floating gate is made using conventional patterning techniques that form the floating gate structure which overlaps 107 portions of the FOX regions. This conventional floating gate is not self-aligned, and leads to larger cell sizes.

The side-view diagram 150 is made along a cross-section shown along line A to B in FIG. 1. The side-view diagram 150 of the flash memory device includes a substrate 117, which is commonly a semiconductor or silicon substrate. A dielectric layer 121 is defined overlying the top surface of the substrate 117. The dielectric layer 121 is typically called the tunnel oxide layer. A floating gate 115 is defined on the tunnel oxide layer. Control gate layer 103 is defined overlying a portion of the floating gate layer 105 to form the "split" gate configuration. A transistor source region 111 is defined in the substrate underlying the tunnel oxide layer. A transistor drain region 113 is defined in the substrate underlying the tunnel oxide layer. The drain region 113 is also coupled to the control gate layer. The contact region is defined overlying the drain region. An interdielectric layer is defined overlying the transistor structures including portions of the control gate layer, the floating gate layer, FOX regions, and other transistor regions.

The above flash device is erased by Fowler-Nordheim tunneling of electrons. For example, selected voltages are applied to the $V_D$, $V_S$, and $V_{CG}$ to inject electrons through the edge of the floating gate to the control gate. The floating gate thereby becomes relatively more positively charged. This shifts the threshold voltage in the negative direction so that in the READ mode the transistor will be "on." In the program mode the control gate is at a high voltage while a fixed voltage is applied to the drain junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

Numerous limitations exist in this conventional cell structure. As line widths become smaller, it becomes advantageous to reduce cell size. Cell size, however, is often limited by the size of the control gate layer, which should be sufficiently large to increase the gate coupling ratio of the flash device. Gate coupling ratio can be defined according to the simplified expression:

$$\text{Gate Coupling Ratio } C_{ono}/(C_{tox}+C_{ono})$$

where $C_{ono}$ is capacitance of the oxide/nitride/oxide; and $C_{tox}$ is capacitance of the tunnel oxide.

As shown in the above expression, gate coupling ratio ("GCR") is generally increased by decreasing the thickness of the tunnel oxide layer, which reduces capacitance of such layer. Unfortunately, it is generally impossible to maintain effective device performance having a tunnel oxide thickness for some conventional devices. Additionally, the geometric configuration of the conventional device limits relative area of the tunnel oxide layer to the ONO layer. Accordingly, GCR simply cannot be adjusted in an easy and cost effective manner. Some manufacturers have attempted to provide different geometric configurations from the conventional device shown by FIGS. 1 and 2, but such configurations often come with the additional expense or limitation in processing the device.

Present Flash EEPROM Structures and Methods

Figure 3:
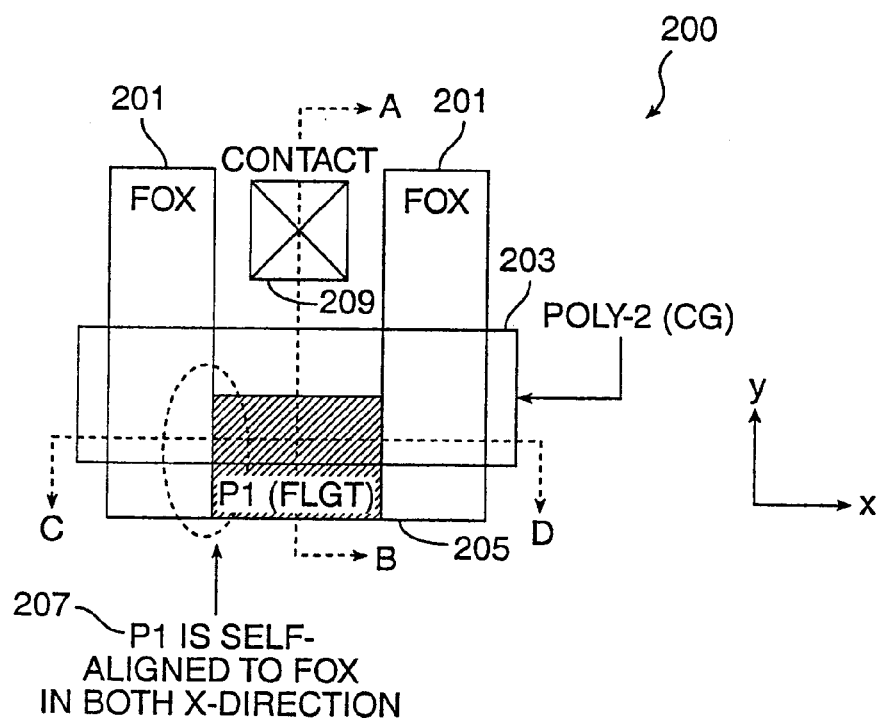
FIGS. 3–4 illustrate simplified diagrams of a flash memory cell according to an embodiment the present invention.
Figure 4:
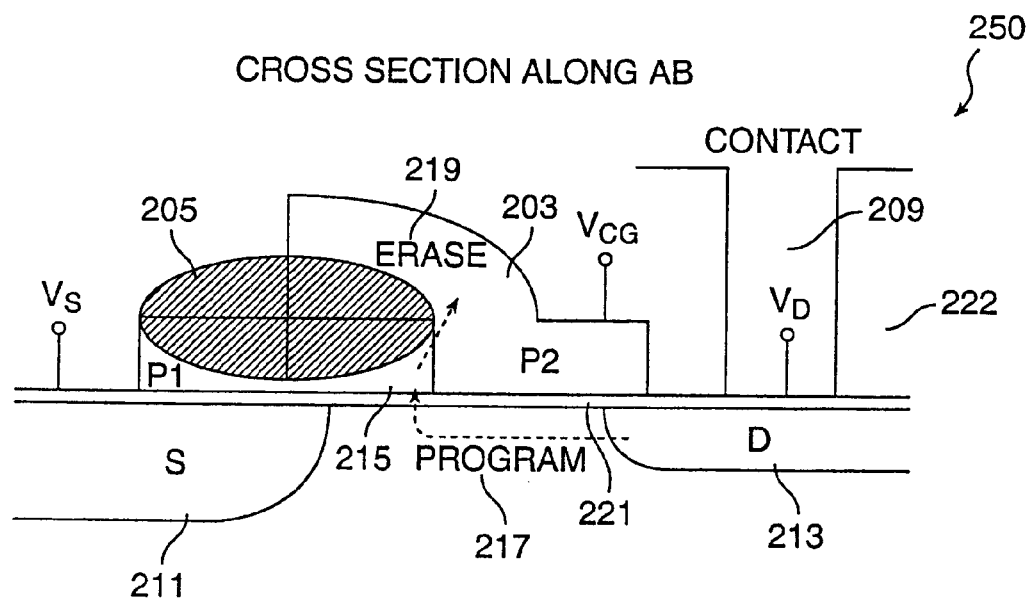
Figure 5:
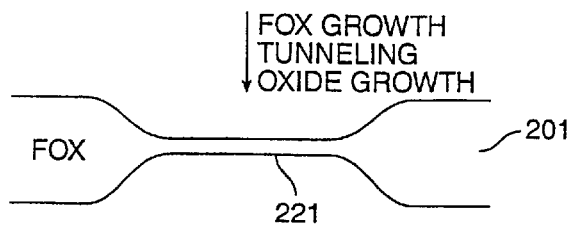
FIGS. 5–13 illustrate a method for fabricating a flash memory cell according to embodiments of the present invention.

FIGS. 3 to 4 illustrate simplified diagrams of a flash memory cell according to an embodiment of the present invention. These diagrams are merely illustrations and should not limit the scope of the claims herein. One of ordinary skill in the art would recognize other variations, modifications, and alternatives. As shown, the diagrams include at least a top-view or plan view diagram 200, and a side-view or cross-sectional view diagram 250 of a split gate flash memory cell according to an embodiment of the present invention. The top-view diagram 200 shows field isolation oxide region(s) 201, which is commonly termed the FOX region(s). The FOX region separates and/or isolates one cell region from another cell region in the active device region. Although the FOX region is shown, other types of isolation processes also can be used depending upon the application.

A flash memory device is defined between the FOX regions. The flash memory device includes a variety of features such as a floating gate 205 that is defined between a portion of the FOX regions. A control gate 203 is defined overlying a portion of the floating gate and is defined overlying portions of the FOX regions. A contact 209 to a source/drain region is also shown. The floating gate 205 is made using a novel sequence of steps such that the floating gate structure is defined within the FOX regions. This present floating gate is self-aligned, as shown by reference numeral 207. Additionally, the floating gate is self-aligned in the lateral or x-direction.

The side-view diagram 250 is made along a cross-section shown along line A to B in FIG. 3. The side-view diagram 250 of the flash memory device includes a substrate 217, which is commonly a semiconductor or silicon substrate. A dielectric layer 221 is defined overlying the top surface of the substrate 217. The dielectric layer 221 is typically called the tunnel oxide layer. The floating gate 205 is defined on the tunnel oxide layer. In some embodiments, the tunnel oxide layer can be replaced by a tunnel nitride layer, a tunnel silicon oxynitride layer, and well as others. In most embodiments, the tunneling layer is substantially free from pin holes and is substantially uniform.

Control gate layer 203 is defined overlying a portion of the floating gate layer 205 to form the "split" gate configuration. A transistor source region 211 is defined in the substrate underlying the tunnel oxide layer. A transistor drain region 213 is defined in the substrate underlying the tunnel oxide layer. The drain region 213 is also coupled to the control gate layer 203. A contact region 209 is defined overlying the drain region 213. An interdielectric layer is defined overlying the transistor structures including portions of the control gate layer, the floating gate layer, FOX regions, and other transistor regions. The interdielectric layer can be made of a variety of materials such as borophosphosilicate glass ("BPSG"), phosphosilicate glass ("PSG"), CVD oxide, fluorinated glass ("FSG"), as well as other dielectric layers.

The device of FIGS. 2 and 4 is merely one device in an array of flash memory cells. In most embodiments, a flash integrated circuit memory chip is made of literally millions of the above devices. In preferred embodiments, the flash memory integrated circuit has at least 256 K cells or 4 Meg. cells. The flash memory cells also can be integrated with a microprocessor in an embedded design as well as other designs. Of course, the particular design and number of cells used depends highly upon the application.

The present flash device is erased by Fowler-Nordheim tunneling of electrons. For example, selected voltages are applied to the $V_S$, $V_{CG}$, and $V_D$ to inject electrons through the edge 219 of the floating gate to the control gate. The floating gate thereby becomes relatively more positively charged. This shifts the threshold voltage in the negative direction so that in the READ mode the transistor will be "on." In the program mode the control gate is at 1.5–3.0 volts while a higher voltage is applied to the source junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

As merely an example, a sequence of selected voltages to perform functions on the device is shown in Table 1. This sequence is merely an illustration and should not limit the scope of the claims herein. One of ordinary skill in the art would recognize other variations, modifications, and alternatives.

| | Voltage | | | |
|---|---|---|---|---|
| Mode | $V_S$ (volt) | $V_{CG}$ (volt) | $V_D$ (volt) | $V_B$ (volt) |
| Program | 8–12 | 2 | 0 | Ground |
| Erase | 0 | 10–15 | Floating | Ground |
| Read | 0 | 4 | 2 | 0 |

A method according to an embodiment of the present invention is briefly outlined as follows:
1. Provide semiconductor substrate;
2. Form N-type well and P-type well;
3. Grow field isolation oxide;
4. Grow tunnel oxide;
5. Form first polysilicon layer (poly-1);
6. Dope first polysilicon layer;
7. Planarize first polysilicon layer;
8. Form nitride layer;
9. Pattern nitride layer;
10. Oxidize first polysilicon layer;
11. Remove patterned nitride layer;
12. Etch first polysilicon layer;
13. Form high voltage implant mask;
14. Perform high voltage implant;
15. Form thin nitride;
16. Form nitride spacer;
17. Form control gate dielectric;
18. Dope second polysilicon layer;
19. Form second polysilicon layer (poly-2);
20. Pattern second polysilicon layer (pattern 1);
21. Etch oxide;
22. Form source oxide;
23. Form second polysilicon layer (poly-2);
24. Form second polysilicon mask (pattern 2);
26. Drive-in source;
27. Implant source/drain regions; and
28. Perform remaining steps.

The above sequence of steps shows a novel method of forming a flash memory cell according to the present invention. This sequence of steps provides numerous benefits such as the self-aligned floating gate, as well as others. The steps are merely an illustration and should not limit the scope of the claims herein. One of ordinary skill in the art would recognize other variations, alternatives, and modifications. Details of the above steps are shown by way of the FIG-URES below.

FIGS. 5–12 illustrate a method for fabricating a flash memory cell according to embodiments of the present invention. These diagrams are merely illustrations and should not limit the scope of the claims herein. One of ordinary skill in the art would recognize other variations, modifications, and alternatives. Like reference numerals are used in these FIGURES as some of the previous FIGURES for easy cross-referencing. The present method begins by forming field isolation oxide regions 201 into a semiconductor substrate, which is commonly silicon, but can be other materials. The field isolation oxide regions 201 are formed using a local oxidation of silicon technique, which is better known as LOCOS, but can be other forms of LOCOS, as well as other isolation processes.

A tunnel dielectric layer 221 or dielectric layer is formed overlying the surface of the semiconductor substrate. In particular, the dielectric layer is defined within the active region between the isolation regions 201. The active region is generally within the recessed region between the two isolation regions 201, as shown. The tunnel dielectric layer is often made of a high quality oxide layer such as thermal oxide or the like. The dielectric layer can also be made of multiple layers as well as silicon oxynitrides, silicon nitride, and other materials.

Figure 6:
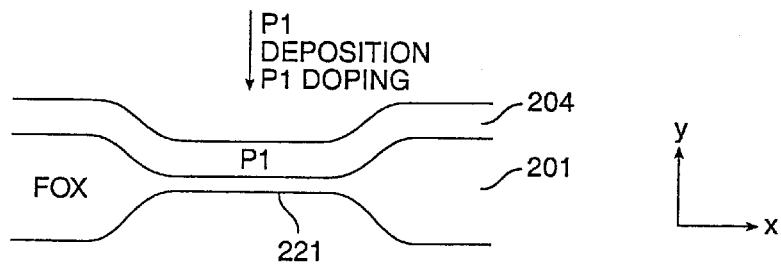

A polysilicon layer 204 is formed overlying the tunnel dielectric layer 221 and isolation regions 201, as shown in FIG. 6. As shown, the polysilicon layer 204 has a relatively consistent thickness and rests overlying the recessed region and the field isolation regions. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCl_3$), in-situ doping (e.g., $PH_3$), and ion implantation. In an embodiment using a design rule of about 0.5 micron or less, the thickness of the polysilicon layer is about 2.0 microns or less. The thickness generally does not matter in most embodiments due to the subsequent planarizing steps.

Figure 7:
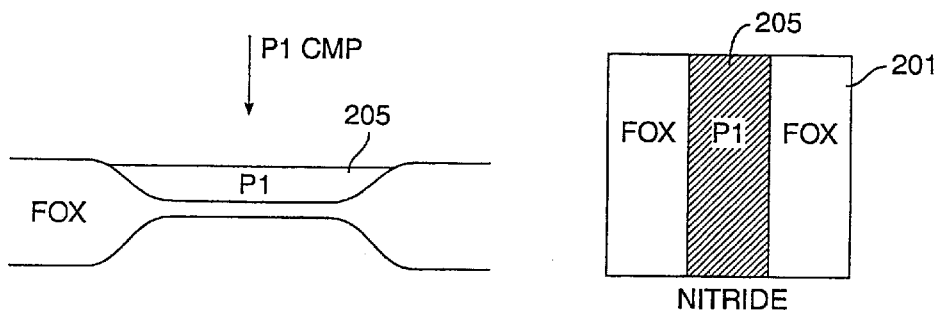

A planarizing step is performed to remove protruding or elevated portions of the polysilicon layer, as shown in FIG. 7. The Fig. shows both side-view and top-view diagrams. The planarizing step often uses techniques such as chemical mechanical polishing or planarization. Chemical mechanical polishing or planarization, commonly referred as CMP, is a technique of polishing materials including semiconductor substrates and films overlying such substrates, which provides a high degree of uniformity and planarity. The process is used to remove high elevation features on films such as those portions of the polysilicon layer on the isolation regions. Chemical mechanical polishing uses an apparatus having a single large polishing pad positioned on a platen, against which a substrate is positioned for polishing. A positioning member positions and biases the substrate to be polished against the polishing pad, which is rotating. A chemical slurry, which is likely to have abrasive materials, is maintained on the polishing pad to modify the polishing characteristics of the polishing pad and to enhance the polishing of the substrate or films.

In a specific embodiment, the chemical mechanical polishing processes using a selected recipe. This recipe uses a slurry including an abrasive material such as a silicon-based material. A solution such as KOH is mixed with the abrasive material. The polishing pad is pressed against the polysilicon layer to remove portions of the polysilicon layer while leaving a substantially planarized layer defined in a recessed region between the isolation regions. As shown, the substantially planarized layer has the same or similar height as the height of the isolation regions. In other embodiments, the height of the substantially planarized layer is lower or even higher, but depends upon the application. The CMP process selectively removes polysilicon over oxide. By way of the polysilicon forming process and planarizing process, a self-aligned layer of polysilicon material is defined.

Figure 8:
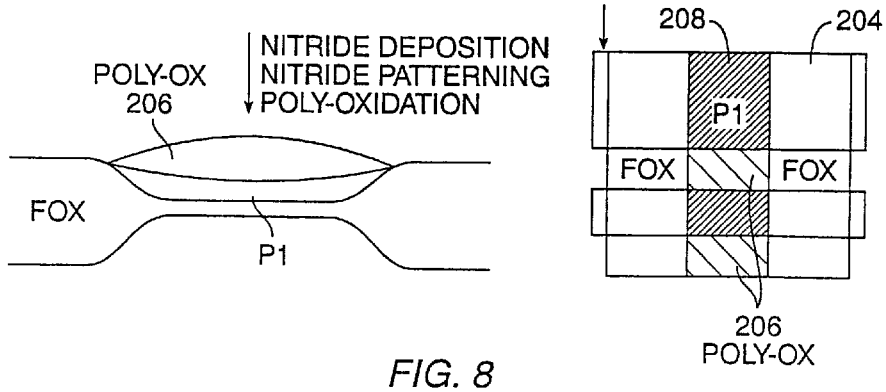
Figure 9:
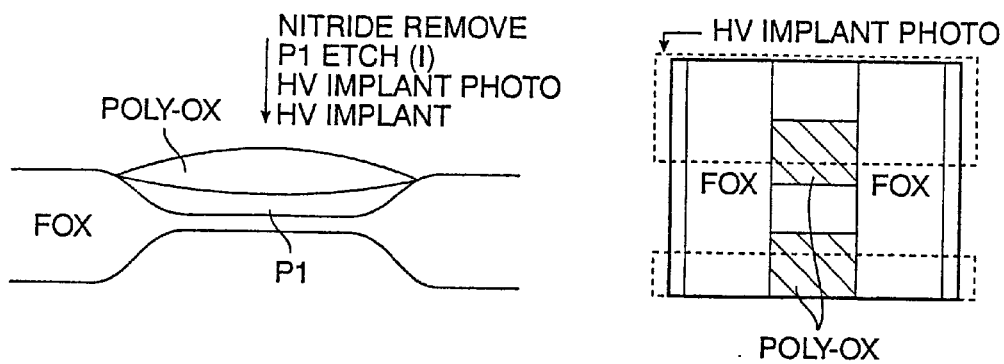

A layer of patterned dielectric material 206 is defined overlying the polysilicon layer 205, as shown in FIG. 8. The dielectric material can be formed using a variety of techniques. The polysilicon layer is masked before oxidation to form the structure shown by the top-view diagram of FIG. 8, for example. In this embodiment, a mask can be a silicon nitride layer 204 that is patterned to have exposed regions. The masked structure is annealed in an oxidation furnace to oxidize exposed regions 206 of the polysilicon layer. The nitride mask layer is then removed. An etching step then takes place to selectively remove a portion 208 of the polysilicon layer shown as P1 in the top-view diagram. An implanting step introduces impurities into the source/drain regions of the device to form lightly doped regions, as shown in the top-view diagram of FIG. 9.

Additional steps are performed on the device. An oxide layer is defined overlying the first polysilicon layer. In a specific embodiment, the present invention uses a furnace oxidation process that relies upon steam oxidation to form a dielectric layer such as an oxide layer. A thin nitride layer is deposited overlying the oxide layer. A subsequent oxide layer can be deposited overlying the nitride layer. The combination of the oxide/nitride/oxide is commonly termed ONO. Of course, the type of dielectric layer used depends upon the application. A spacer is often formed from these dielectric layers.

Figure 10:
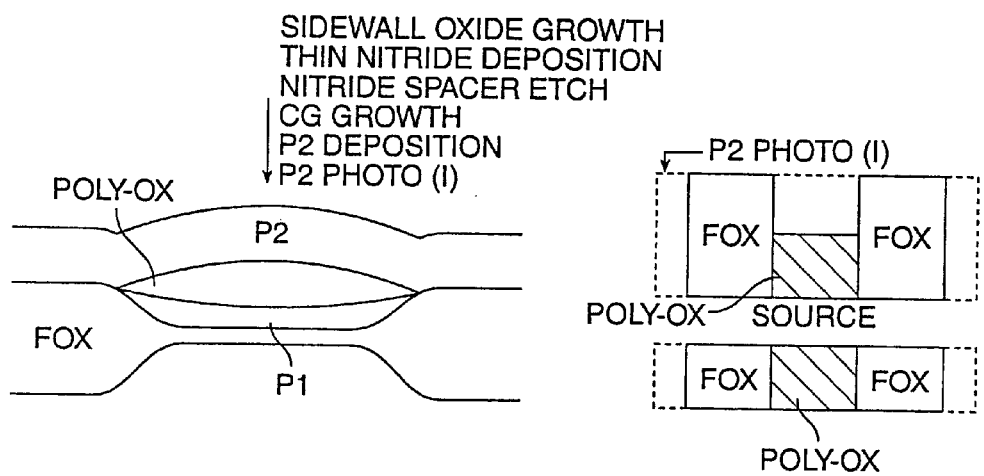
Figure 11:
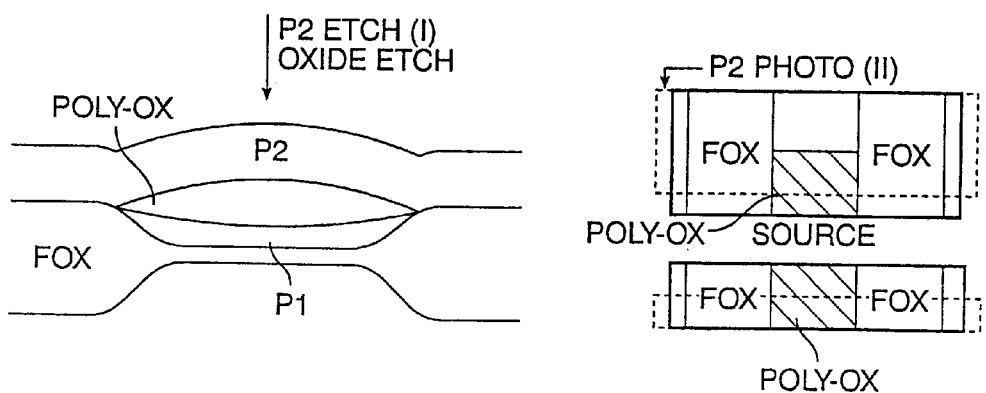
Figure 12:
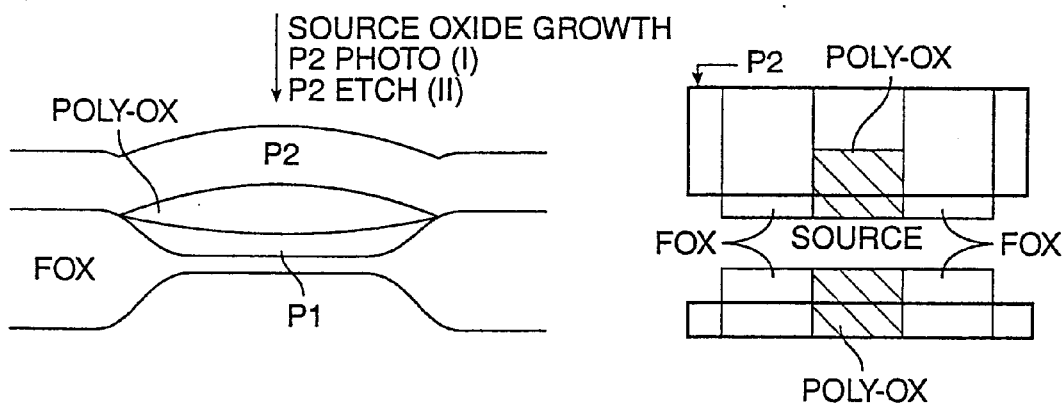

A second polysilicon layer or control gate layer is defined overlying the surface of the structure. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCL_3$), in-situ doping (e.g., $PH_3$), and ion implantation. The second polysilicon layer is defined using masking and etching steps, as shown in FIG. 10. A subsequent oxide etching step removes or clears oxide overlying source/drain regions. A clean oxide layer is grown overlying source/drain regions. The second polysilicon layer is masked and etched again as shown in FIG. 11. A partially completed device structure illustrating the floating and control gates is shown by FIGS. 12 and 13.

Figure 13:
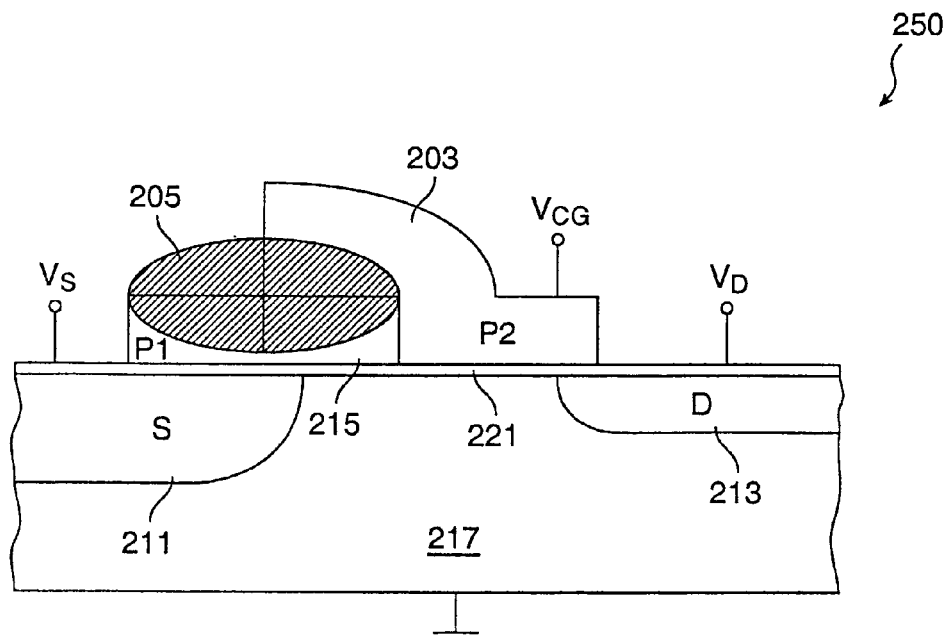

Referring to FIG. 13, the side-view diagram 250 of the flash memory device includes substrate 217, which is commonly a semiconductor or silicon substrate. The dielectric layer 221 is defined overlying the top surface of the substrate 217. The dielectric layer 221 is typically called the tunnel oxide layer. The floating gate 205 is defined on the tunnel oxide layer. In some embodiments, the tunnel oxide layer can be replaced by a tunnel nitride layer, a tunnel silicon oxynitride layer, and well as others. In most embodiments, the tunneling layer is substantially free from pin holes and is substantially uniform.

Control gate layer 203 is defined overlying a portion of the floating gate layer to form the "split" gate configuration. The transistor source region 211 is defined in the substrate underlying the tunnel oxide layer. The transistor drain region 213 is defined in the substrate underlying the tunnel oxide layer. The drain region is also coupled to the control gate layer. The contact region is defined overlying the drain region. An interdielectric layer is defined overlying the transistor structures including portions of the control gate layer, the floating gate layer, FOX regions, and other transistor regions. The interdielectric layer can be made of a variety of materials such as borophosphosilicate glass ("BPSG"), phosphosilicate glass ("PSG"), CVD oxide, fluorinated glass ("FSG"), as well as other dielectric layers.

While the above is a full description of the specific embodiments, various modifications, alternative constructions and equivalents may be used. For example, specific dimensions are discussed above for the specific embodiments. But of course, these dimensions may depend on the particular application. Therefore, the above description and illustrations should not be taken as limiting the scope of the present invention which is defined by the appended claims.

What is claimed is:

1. A method of forming a non-volatile memory device having a split-gate structure, comprising:

providing a semiconductor substrate;

forming a first isolation region and a second isolation region in said semiconductor substrate, said isolation regions having an active region defined in a recessed region between said first isolation region and said second isolation regions;

a first doped region and a second doped region provided within the active region, the first and second doped regions being separated by an area having a first portion and a second portion;

forming a dielectric layer overlying said active region;

forming a thickness of material overlying said first isolation region, said second isolation region, and said active region;

selectively removing portions of said thickness of material overlying portions of said first isolation region and said second isolation region leaving a substantially planar material region in said recessed region, said substantially planar material region being self-aligned into said recessed region;

selectively etching said substantially planar material region to form a floating gate overlying said first portion of said area but not said second portion of said area; and forming a control gate overlying said second portion of said area and a portion of said first portion of said area.

2. The method of claim 1 wherein said selectively removing step is provided by chemical mechanical polishing.

3. The method of claim 1 wherein said dielectric layer comprises an oxide layer.

4. The method of claim 1 wherein said thickness of material comprises polysilicon.

5. The method of claim 1 wherein said first isolation region and said second isolation region are made using a local oxidation of silicon process.

6. The method of claim 1 wherein said substantially planar material region is defined as a floating gate.

7. The method of claim 1 further comprising a step of forming a dielectric layer overlying said substantially planar material region.

8. The method of claim 7 further comprising a step of forming a control gate layer overlying said dielectric layer.

9. The method of claim 8 wherein said substantially planar material region, said dielectric layer, and said control gate layer define a gate structure for an EEPROM semiconductor device.

10. The method of claim 9 wherein said EEPROM semiconductor device comprises a flash EEPROM semiconductor device.

11. A method of forming a semiconductor device having a split-gate flash memory cell, comprising:

providing a semiconductor substrate;

forming a first isolation region and a second isolation region in said semiconductor substrate, said isolation regions having an active region defined in a recessed region between said first isolation region and said second isolation region;

forming a dielectric layer overlying said active region;

forming a thickness of material overlying said first isolation region, said second isolation region, and said active region;

selectively removing portions of said thickness of material overlying portions of said first isolation region and said second isolation region leaving a substantially planar material region in said recessed region, said substantially planar material region being self-aligned into said recessed region, said substantially planar material region being a floating gate;

forming a dielectric layer overlying said floating gate; and forming a control gate layer overlying said dielectric layer and selectively etching said control gate layer to form a control gate that is partly overlying said floating gate and off-centered therefrom to form a split-gate structure.

12. The method of claim 11, wherein said thickness of material is removed by a chemical mechanical polishing process.

13. The method of claim 11, wherein said floating gate does not extend into said isolation regions to the area of said floating gate that is coupled to said control gate.

14. The method of claim 11, wherein forming said control gate includes:

selectively etching said control gate layer to expose a source region; and thereafter, selectively etching a portion of said control gate layer that is adjacent to said source region.

15. A method of forming a flash memory device having a memory cell with a split-gate structure, comprising:

providing a semiconductor substrate;

forming a first isolation region and a second isolation region in said semiconductor substrate, said isolation regions having an active region defined in a recessed region between said first isolation region and said second isolation region;

forming a dielectric layer overlying said active region;

forming a floating gate layer overlying said first and said second isolation regions and said active region;

selectively removing portions of said floating gate layer overlying portions of said first and second isolation regions leaving a substantially planar material region in said recessed region to reduce the size of said memory cell, said substantially planar material region being self-aligned into said recessed region to form a floating gate;

forming a dielectric layer overlying said floating gate; and forming a control gate layer overlying said dielectric layer;

selectively etching said control gate layer to expose a source region; and thereafter, selectively etching a portion of said control gate layer adjacent to said source region to form a control gate that is partly overlying said floating gate and off-centered therefrom.

* * * * *